(12) United States Patent
Choi et al.

(10) Patent No.: US 7,858,572 B2
(45) Date of Patent: Dec. 28, 2010

(54) COMPOSITION FOR REMOVING POLYMER RESIDUE OF PHOTOSENSITIVE ETCHING-RESISTANT LAYER

(75) Inventors: Ho-Sung Choi, Anyang-shi (KR); Deok-Ho Kim, Yongin-shi (KR)

(73) Assignee: Liquid Technology Co., Ltd., Seongnam-shi (KR)

( * ) Notice: Subject to any disclaimer, the term of this patent is extended or adjusted under 35 U.S.C. 154(b) by 142 days.

(21) Appl. No.: 12/087,137

(22) PCT Filed: Dec. 19, 2006

(86) PCT No.: PCT/KR2006/005563

§ 371 (c)(1),
(2), (4) Date: Sep. 17, 2008

(87) PCT Pub. No.: WO2007/074990

PCT Pub. Date: Jul. 5, 2007

(65) Prior Publication Data

US 2009/0170741 A1      Jul. 2, 2009

(30) Foreign Application Priority Data

Dec. 26, 2005    (KR) .................. 10-2005-0129712

(51) Int. Cl.
*C11D 7/50* (2006.01)
(52) U.S. Cl. .................. 510/175; 510/176; 510/506
(58) Field of Classification Search .............. 510/175, 510/176, 506
See application file for complete search history.

(56) References Cited

U.S. PATENT DOCUMENTS

| 6,869,921 | B2 * | 3/2005 | Koito et al. | 510/176 |
| 7,361,631 | B2 * | 4/2008 | Egbe et al. | 510/175 |
| 2004/0142835 | A1 * | 7/2004 | Takashima | 510/175 |
| 2006/0003910 | A1 * | 1/2006 | Hsu et al. | 510/176 |
| 2006/0046944 | A1 * | 3/2006 | Hata et al. | 510/175 |
| 2009/0229629 | A1 * | 9/2009 | Lee et al. | 134/3 |
| 2009/0233827 | A1 * | 9/2009 | Egbe et al. | 510/176 |

FOREIGN PATENT DOCUMENTS

| EP | 1 318 432 A1 | 6/2003 |
| WO | WO 2004/030038 A2 | 4/2004 |
| WO | WO 2004/107056 A1 | 12/2004 |

OTHER PUBLICATIONS

International Search Report, dated Mar. 26, 2007, corresponding to PCT/KR2006/005563.

* cited by examiner

*Primary Examiner*—Gregory E Webb
(74) *Attorney, Agent, or Firm*—Christie, Parker & Hale, LLP

(57) ABSTRACT

Provided is a composition for removing polymer residue of a photosensitive etching-resistant layer. The composition includes 0.1 to 80% by weight of a corrosion inhibitor shown in Formula 1; 10 to 80% by weight of a pH control agent of which hydrogen ion concentration is in a weak basic range; 0.1 to 2% by weight of ammonium fluoride; and the remaining percentage by weight of water. The composition for removing the polymer residue can effectively remove insoluble residue generated during a semiconductor fabrication process without inflicting damage on an underlying layer and contains environment-friendly components.

5 Claims, 2 Drawing Sheets

BEFORE TREATMENT

AFTER TREATMENT

[Fig. 1]
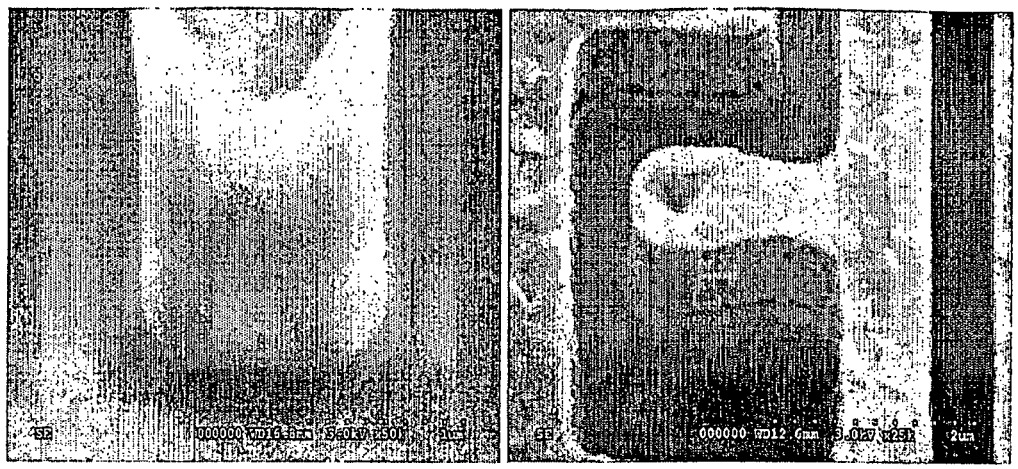
BEFORE TREATMENT　　AFTER TREATMENT
[Fig. 2]
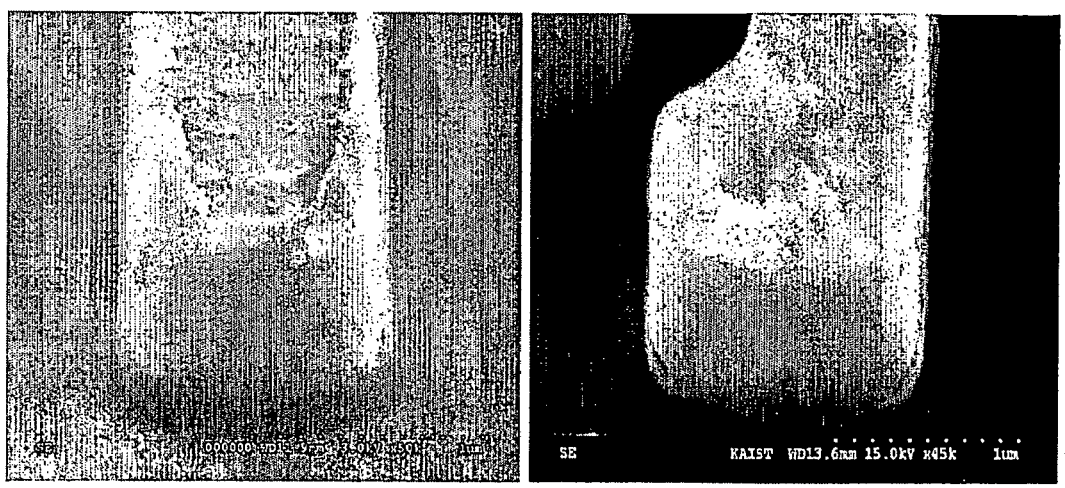
BEFORE TREATMENT　　AFTER TREATMENT
[Fig. 3]
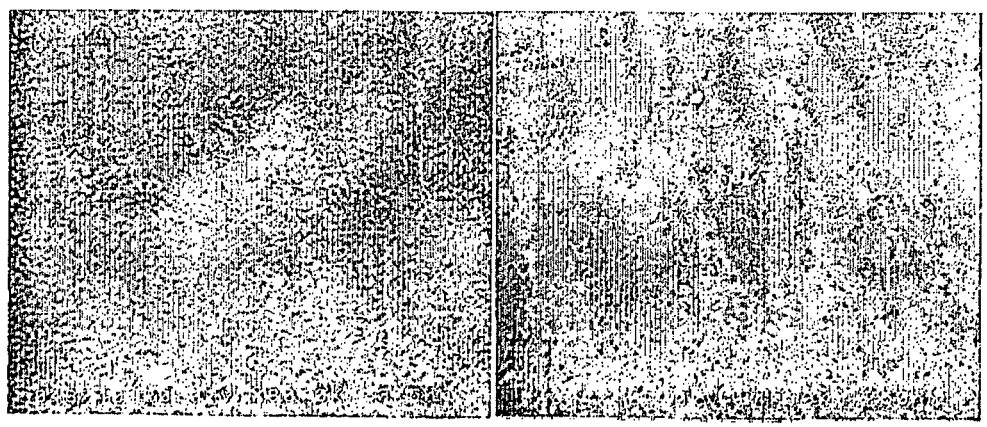
BEFORE TREATMENT　　AFTER TREATMENT

[Fig. 4]
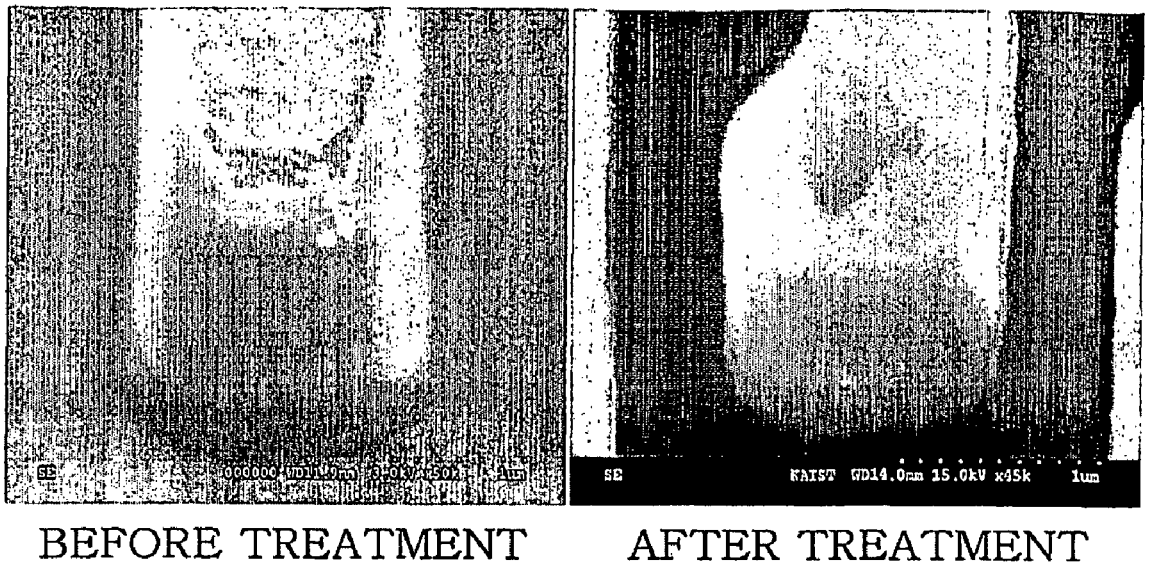
BEFORE TREATMENT    AFTER TREATMENT
[Fig. 5]
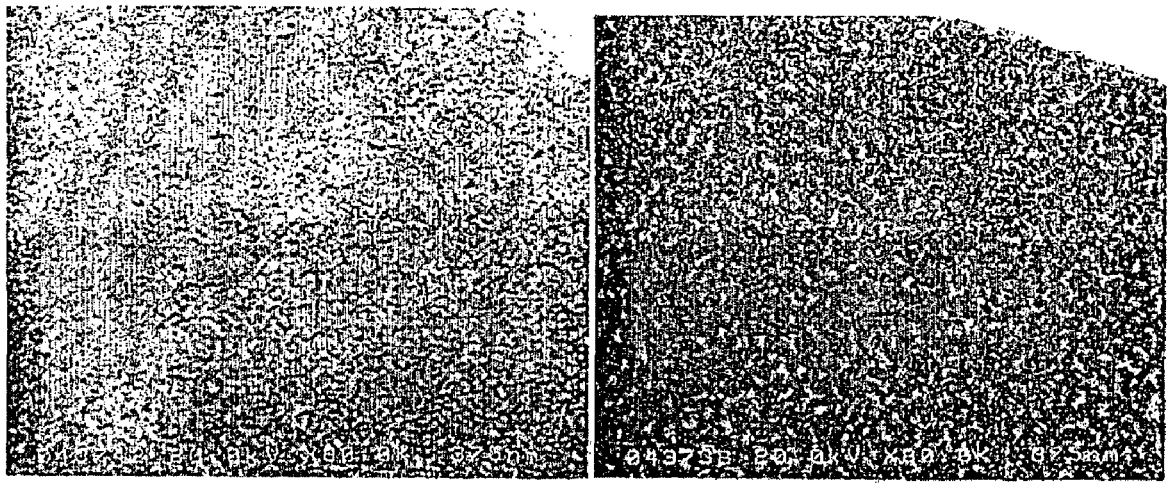
EMBODIMENT 4    EMBODIMENT 5

COMPOSITION FOR REMOVING POLYMER RESIDUE OF PHOTOSENSITIVE ETCHING-RESISTANT LAYER

CROSS-REFERENCE TO RELATED APPLICATION

This application is a National Phase Patent Application of International Application Number PCT/KR2006/005563, filed on Dec. 19, 2006, which claims priority of Korean Patent Application Number 10-2005-0129712, filed on Dec. 26, 2005.

BACKGROUND ART

1. Field of the Invention

The present invention relates to a composition for removing polymer residue of a photosensitive etching-resistant layer, and more particularly, to a composition for removing polymer residue of a photosensitive etching-resistant layer, which is highly capable of removing polymer residue and environmentally friendly.

2. Description of Related Art

A semiconductor fabrication process includes a series of processes for forming a metal wire or a contact point, such as a photolithography process, a dry or wet etching process, a plasma ashing process, and so on, which generate organic or metal residue. This residue should be removed before a subsequent process is performed.

Conventionally, the residue has been removed using a composition composed of hydroxylamine, alcohol amines, water, and a corrosion inhibitor at a high temperature of 60 to 85° C. However, since the composition containing amines generates hydroxyl ions during a water cleaning process, isopropyl alcohol (IPA) has been used as an intermediate rinse to prevent corrosion.

Presently, ACT-935 (available from ACT) and EKC-265 (available from DUPONT) are typical products of the composition used to remove the residue. However, these compositions are limited in application due to galvanic corrosion and toxicity.

In recent years, new compositions using fluorine have been introduced along with developments in cleaning apparatuses and reduction in semiconductor linewidth. These compositions may be applied to a dilute hydrofluoric acid (DHF) cleaning process or a buffered oxide etchant (BOE) (or a mixture of HF and NH$_4$F) cleaning process that belongs to a conventional semiconductor fabrication process. In this case, the DHF or BOE cleaning process is carried out using a polar solvent and a corrosion inhibitor at a room temperature of 20 to 30° C. In the DHF or BOE cleaning process using the compositions containing fluorine, although no intermediate rinse need be performed, there is a disadvantage in which an oxide can attack a pattern.

As described above, the conventional compositions for removing residue lead to the frequent occurrence of corrosion of an underlying layer or damage of a metal wire due to a galvanic reaction, thus greatly affecting an electric resistance. Also, due to particles reattached from the compositions to the surface of a wafer, the yield of semiconductor devices decreases. Further, as these compositions contain toxic chemicals, i.e. phenols, such as catechol and pyrogallol used as corrosion inhibitors and amides or amines used as polar solvents of the compositions, they may have bad effects on the human body.

The amides or amines are basically used for a pH controlling solution of which hydrogen ion concentration is held at a constant level in order to stably remove residue caused by a dry etching process. In conventionally used hydroxylamine, alkanolamine (e.g., monoethanolamine) is mixed with water to buffer hydrogen ions. In fluorine, an organic acid is mixed with amines to form an acidic or basic controlling solution. However, amines corrode metals and cannot form environmentally friendly compositions due to the toxicity as described above.

Accordingly, the inventors have made efforts to develop a cleaning agent, which contains environmentally friendly components and can remove residue caused by a semiconductor fabrication process without inflicting damage on an underlying metal layer that is formed on a semiconductor wafer and formed of titanium (Ti), titanium nitride (TiN), tungsten (W), tungsten nitride (WN), aluminum (Al), copper (Cu), tungsten silicide (WSix), or cobalt silicide (CoSix). Thus, the inventors discovered that a composition for removing polymer residue using tetrahydrofurfuryl alcohol (THFA) instead of phenols as a corrosion inhibitor and using diethylene glycol monoethyl ether (EDG) instead of amines as a pH control agent can effectively remove insoluble residue generated during a semiconductor fabrication process, needs no intermediate cleaning process, and also has no toxicity.

SUMMARY OF THE INVENTION

The present invention is directed to a composition for removing polymer residue of a photosensitive etching-resistant layer, which can remove residue generated after a semiconductor fabrication process, specially, a metal etching process and a via or pad contact etching (dry etching) process without damaging underlying layers.

One aspect of the present invention is to provide a composition for removing polymer residue of a photosensitive etching-resistant layer comprising: 0.1 to 80% by weight of a corrosion inhibitor shown in Formula 1; 10 to 80% by weight of a pH control agent of which hydrogen ion concentration is in a weak basic range; 0.1 to 2% by weight of ammonium fluoride; and the remaining percentage by weight of water:

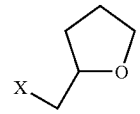

(Formula 1)

where X is —OH or —NH$_2$.

The corrosion inhibitor may be tetrahydrofurfuryl alcohol (THFA) or tetrahydrofurfuryl amine (THFN).

The pH control agent may be at least one selected from the group consisting of diethylene glycol monomethyl ether, diethylene glycol monoethyl ether, and diethylene glycol monobutyl ether.

Also, the composition for removing the polymer residue of the photosensitive etching-resistant layer may be in the range of pH 7.5 to 8.5.

ADVANTAGEOUS EFFECTS

A composition for removing polymer residue of a photosensitive etching-resistant layer according to the present invention can effectively remove insoluble residue generated after a dry etching process and an ashing process and does not produce hydroxyl ions during a water cleaning process. Thus, no subsequent process using an organic solvent is required.

Also, the composition for removing the polymer residue according to the present invention employs tetrahydrofurfuryl alcohol (THFA) instead of conventionally used phenols as a corrosion inhibitor and contains a non-amine pH control agent instead of amines. Therefore, the composition according to the present invention is environmentally friendly.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIG. 1 shows scanning electron microscope (SEM) photographs taken before and after a metal wire disposed on a wafer is treated with a composition of Comparative example 1;

FIG. 2 shows SEM photographs taken before and after a metal wire disposed on a wafer is treated with a composition according to a first exemplary embodiment of the present invention;

FIG. 3 shows SEM photographs taken before and after a pad disposed on a wafer is treated with a composition according to a second exemplary embodiment of the present invention;

FIG. 4 shows SEM photographs taken before and after a metal wire disposed on a wafer is treated with a composition according to a third exemplary embodiment of the present invention; and FIG. 5 shows SEM photographs taken after a pad disposed on a wafer is treated with compositions according to fourth and fifth exemplary embodiments of the present invention.

DETAILED DESCRIPTION OF THE PREFERRED EMBODIMENTS

The present invention will now be described more fully hereinafter with reference to the accompanying drawings, in which exemplary embodiments of the invention are shown.

A composition for removing polymer residue of a photosensitive etching-resistant layer according to the present invention is formed of 0.1 to 80% by weight of a corrosion inhibitor shown in Formula 1, 10 to 80% by weight of a pH control agent having a hydrogen ion concentration in a weak basic range, 0.1 to 2% by weight of ammonium fluoride, and the remaining percentage by weight of water.

The corrosion inhibitor shown in Formula 1 is nontoxic unlike a conventionally used corrosion inhibitor (i.e., phenol). The corrosion inhibitor may be tetrahydrofurfuryl alcohol (X=—OH) or tetrahydrofurfurylamine (X=NH$_2$). Typically, the corrosion inhibitor may be tetrahydrofurfuryl alcohol.

The above-described corrosion inhibitor can minimize the corrosion of metal or damage of silicon oxide due to a galvanic reaction caused by fluorine. As shown in the following Formulas 2 and 3, tetrahydrofurfuryl alcohol or tetrahydrofurfurylamine is coordinately bonded to metal or oxide of an underlying layer to form an organic protective layer on the surface of the underlying layer, so that the corrosion or damage of the underlying layer due to fluorine can be prevented. Since this organic protective layer can be easily mixed with water, the organic protective layer can be easily removed by a subsequent water cleaning process.

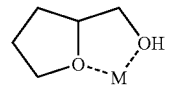

(Formula 2)

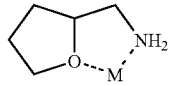

(Formula 3)

The corrosion inhibitor may be in a range of 0.1 to 80% by weight based on the total weight of the entire composition. When the composition is formed of less than 0.1% by weight of the corrosion inhibitor, a good corrosion inhibition effect cannot be expected. Also, the corrosion inhibitor cannot exceed 80% by weight considering a mixture ratio of the corrosion inhibitor with other components. More specifically, as the amount of tetrahydrofurfuryl alcohol increases, a corrosion inhibition effect becomes better. However, when the amount of tetrahydrofurfurylamine exceeds an appropriate range, the underlying metal layer may be corroded. Therefore, the composition may be formed of less than 40% by weight of tetrahydrofurfurylamine.

In the composition for removing the polymer residue of the photosensitive etching-resistant layer according to the present invention, the pH control agent of which hydrogen ion concentration is in a weak basic range may be diethylene glycol monomethyl ether, diethylene glycol monoethyl ether (EDG), or diethylene glycol monobutyl ether. Typically, the pH control agent may be EDG. Hydrogen ion exponent (pH) is very important to all corrosion reactions. Because fluorine severely corrodes metal in acidic and strong basic ranges and, specially, causes galvanic corrosion in the acidic range, the pH control agent of which hydrogen ion concentration is in the weak basic range may be desirably used for the composition for removing polymer residue. Also, the pH control agent does not belong to amines and thus is environment-friendly.

The pH control agent may be mixed with water to form a pH controlling solution. Even if the pH control agent is mixed with water, its hydrogen ion exponent hardly varies. Thus, the pH controlling solution may be in the range of pH 7.5 to 9.0.

The pH control agent may be in the range of 10 to 80% by weight based on the total weight of the entire composition. When the composition is formed of less than 10% by weight of the pH control agent, the amount of the pH control agent is too small to maintain the performance of the composition for a long time. Also, when the composition is formed of more than 80% by weight of the pH control agent, the underlying metal layer may be corroded.

Ammonium fluoride, which is another component of the composition for removing the polymer residue of the photosensitive etching-resistant layer, is added as a reaction accelerator, so that not only photosensitive organic material but also organic metal residue generated after a plasma etching process can be removed easily and rapidly.

Ammonium fluoride may be in the range of 0.1 to 2.0% by weight based on the total weight of the entire composition. When the composition is formed of less than 0.1% by weight, residue removal capability is greatly lowered. Also, when the composition is formed of more than 2.0% by weight, the underlying oxide layer or metal layer may be corroded.

Exemplary embodiments of the present invention will now be described, but this invention should not be construed as limited to the embodiments set forth herein.

Embodiments 1 to 4

Compositions for removing polymer residue of a photosensitive etching-resistant layer were produced as shown in Table 1.

Comparative Example 1

As can be seen from Table 1, a composition for removing polymer residue of a photosensitive etching-resistant layer without using a corrosion inhibitor was produced.

TABLE 1

| | Compositions | | | |
|---|---|---|---|---|
| | Corrosion inhibitor (% by weight) | Control agent (% by weight) | Water (% by weight) | AF (% by weight) |
| Embodiment 1 | THFA (5.0) | EDG (64.0) | 30.0 | 1.0 |
| Embodiment 2 | THFN (5.0) | EDG (64.0) | 30.0 | 1.0 |
| Embodiment 3 | THFA (20.0) | EDG (59.0) | 20.0 | 1.0 |
| Embodiment 4 | THFA (69.0) | EDG (10.0) | 20.0 | 1.0 |
| Comparative example 1 | — | EDG (79.0) | 20.0 | 1.0 |

EDG: diethylene glycol monoethyl ethr
THFA: tetrahydrofurfuryl alcohol
THFN: tetrahydrofurfurylamine
AF: ammonium fluoride Experimental Example 1

In the composition for removing the polymer residue of the photosensitive etching-resistant layer according to the present invention, when EDG, which is used as a pH control agent, was mixed with water in different ratios, the results of hydrogen ion exponent (pH) were obtained as shown in Table 2.

TABLE 2

| | Deionized water (%) | EDG (%) | pH @ 25° C. |
|---|---|---|---|
| 1 | 50 | 50 | 9.1 |
| 2 | 70 | 30 | 8.9 |
| 3 | 95 | 5 | 8.3 |

As can be seen from Table 2, the hydrogen ion concentration of EDG was in a weak basic region, and there was little variation in pH relative to the amount of deionized water. Based on the results, it can be confirmed that EDG is a pH control agent that is not in amines but in the weak basic range.

Experimental Example 2

The composition of Comparative example 1 was put in a beaker, and a fragment of a wafer having a metal wire was soaked in the composition and treated at a room temperature for 10 minutes. FIG. 1 shows scanning electron microscope (SEM) photographs taken before and after the metal wire disposed on the wafer is treated with the composition of Comparative example 1.

As can be seen from FIG. 1, it can be observed that a large portion of an aluminum wire was corroded.

The composition of Embodiment 1 was put in a beaker, and a fragment of a wafer having a metal wire was soaked in the composition and treated at a room temperature for 10 minutes. FIG. 2 shows SEM photographs taken before and after the metal wire disposed on the wafer is treated with the composition of Embodiment 1.

The composition of Embodiment 2 was put in a beaker, and a fragment of a wafer having a pad was soaked in the composition and treated at a room temperature for 10 minutes. FIG. 3 shows SEM photographs taken before and after the pad disposed on the wafer is treated with the composition of Embodiment 2.

Also, the composition of Embodiment 3 was put in a beaker, and a fragment of a wafer having a metal wire was soaked in the composition and treated at a room temperature for 10 minutes. FIG. 3 shows SEM photographs taken before and after the metal wire disposed on the wafer is treated with the composition of Embodiment 3.

Referring to FIGS. 2 and 3, it can be observed that the compositions of Embodiments 1 and 2 caused the corrosion of a small portion of an aluminum wire. However, when the amount of water was reduced, the corrosion of the aluminum wire was greatly improved. Referring to FIG. 4, it can be observed that the composition of Embodiment 3 did not corrode a metal wire.

Further, in order to compare the composition of Embodiment 3 with the composition of Embodiment 4, each of the compositions of Embodiments 3 and 4 was put in a beaker, and a fragment of a wafer having a pad was soaked in the composition and treated at a room temperature for 10 minutes. FIG. 5 shows SEM photographs taken after the pad disposed on the wafer is treated with each of the compositions of Embodiments 3 and 4. As can be seen from FIG. 5, the composition of Embodiment 4, which contained a larger amount of tetrahydrofurfuryl alcohol as a corrosion inhibitor, produced a better corrosion inhibition effect than the composition of Embodiment 3.

Experimental Example 3

In order to measure the corrosiveness of the composition according to the present invention with respect to an underlying layer excluding impurities, a variety of substrates were treated with the composition of Embodiment 3 at a room temperature for 10 minutes, cleaned using water, and dried using nitrogen gas. Thereafter, the thicknesses of the substrates were measured before and after treatment, and Table 3 shows the results.

TABLE 3

| Substrate material | Al | Ti | TiN | FSG | BPSG | SOG |
|---|---|---|---|---|---|---|
| Etch rate(A/min) | <10 | <1 | <1 | 5 | <3 | <3 |

From Table 3, it can be confirmed that the composition for removing the polymer residue of the photosensitive etching-resistant layer according to the present invention hardly corroded the underlying layer excluding impurities.

A composition for removing polymer residue of a photosensitive etching-resistant layer according to the present invention can effectively remove insoluble residue generated after a dry etching process and an ashing process and does not produce hydroxyl ions during a water cleaning process. Thus, no subsequent process using an organic solvent is required.

Also, the composition for removing the polymer residue according to the present invention employs tetrahydrofurfuryl alcohol (THFA) instead of conventionally used phenols as a corrosion inhibitor and contains a non-amine pH control agent instead of amines. Therefore, the composition according to the present invention is environmentally friendly.

While the invention has been shown and described with reference to certain exemplary embodiments thereof, it will be understood by those skilled in the art that various changes in form and details may be made therein without departing from the spirit and scope of the invention as defined by the appended claims.

The invention claimed is:

1. A composition for removing polymer residue of a photosensitive etching-resistant layer comprising:
   0.1 to 80% by weight of a corrosion inhibitor shown in Formula 1;
   10 to 80% by weight of a pH control agent of which hydrogen ion concentration is in a weak basic range;
   0.1 to 2% by weight of ammonium fluoride; and
   the remaining percentage by weight of water,

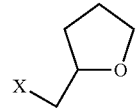
(Formula 1)

wherein, X is —NH$_2$.

2. The composition according to claim 1, wherein the corrosion inhibitor further comprises tetrahydrofurfuryl alcohol.

3. The composition according to claim 1, wherein the pH control agent is at least one selected from the group consisting of diethylene glycol monomethyl ether, diethylene glycol monoethyl ether, and diethylene glycol monobutyl ether.

4. The composition according to claim 3, wherein the pH control agent is diethylene glycol monoethyl ether.

5. The composition according to claim 1, which is in the range of pH 7.5 to 8.5.

* * * * *